United States Patent
Kobayashi et al.

[11] Patent Number: 6,085,764
[45] Date of Patent: Jul. 11, 2000

[54] CLEANING APPARATUS AND METHOD

[75] Inventors: Kanji Kobayashi; Masao Yamaguchi, both of Nagano; Shinya Yoshihara, Akita; Toshio Kubota, Nagano; Jun Kudo, Akita, all of Japan

[73] Assignee: TDK Corporation, Tokyo, Japan

[21] Appl. No.: 09/098,751

[22] Filed: Jun. 17, 1998

[30] Foreign Application Priority Data

Jul. 22, 1997 [JP] Japan .................................. 9-210196

[51] Int. Cl.$^7$ ...................................................... B08B 3/12
[52] U.S. Cl. ............................ 134/147; 134/184; 134/902
[58] Field of Search ................................ 134/1, 184, 186, 134/201, 14, 157, 185, 161, 164, 902, 1.3, 147; 366/127, 112, 216, 219, 212; 451/113

[56] References Cited

U.S. PATENT DOCUMENTS

| | | |
|---|---|---|
| 2,702,260 | 2/1955 | Massa . |
| 4,710,233 | 12/1987 | Hohmann et al. ........................... 134/1 |
| 4,762,668 | 8/1988 | Loose et al. ............................... 376/310 |
| 4,823,513 | 4/1989 | Marcus et al. ............................... 51/7 |
| 5,038,808 | 8/1991 | Hammond et al. ...................... 134/184 |
| 5,090,432 | 2/1992 | Bran ......................................... 134/139 |
| 5,143,103 | 9/1992 | Basso et al. ............................. 134/98.1 |
| 5,143,106 | 9/1992 | Bannon .................................... 134/184 |
| 5,203,362 | 4/1993 | Shibata ..................................... 134/184 |
| 5,378,287 | 1/1995 | Pedziwiatr .................................... 134/1 |
| 5,450,733 | 9/1995 | Kim et al. ................................. 68/3 SS |
| 5,520,205 | 5/1996 | Guldi et al. ............................. 134/98.1 |
| 5,553,106 | 9/1996 | Enomoto et al. ........................ 376/305 |
| 5,579,792 | 12/1996 | Stanasolovich e tal. ................ 134/184 |
| 5,653,860 | 8/1997 | Nicholls et al. ........................... 205/80 |

FOREIGN PATENT DOCUMENTS

| | | |
|---|---|---|
| 52900/98 | 6/1998 | Australia . |
| 3614960 | 11/1987 | Germany ..................................... 134/1 |
| 6-320124 | 11/1994 | Japan . |
| 07014814 | 1/1995 | Japan . |
| 8-108155 | 4/1996 | Japan . |
| 08141527 | 6/1996 | Japan . |
| 8-141527 | 6/1996 | Japan . |
| WO 8907492 | 8/1989 | U.S.S.R. ..................................... 134/1 |

*Primary Examiner*—Philip R. Coe
*Attorney, Agent, or Firm*—Arent Fox Kintner Plotkin & Kahn, PLLC

[57] ABSTRACT

A cleaning apparatus includes a cleaning tank for reserving cleaning fluid, an object to be cleaned being immersed in the cleaning fluid, a vibrator for vibrating the cleaning fluid in the cleaning tank, and two micro-vibration sources for minutely vibrating the object to be cleaned in two different directions.

9 Claims, 1 Drawing Sheet

CLEANING APPARATUS AND METHOD

FIELD OF THE INVENTION

The present invention relates to an apparatus and method for cleaning an object to be cleaned, such as a wafer or the like, using for example ultrasonic vibration.

DESCRIPTION OF THE RELATED ART

A cleaning apparatus, in which an object to be cleaned such as a wafer is immersed in cleaning fluid and the cleaning fluid is ultrasonically vibrated or oscillated, is well known. In order to enhance the cleaning power of such kinds of ultrasonic cleaning apparatus, various attempts have been made.

In, for example, Japanese Unexamined Patent Publication No. 6(1994)-320124, is described an ultrasonic cleaning apparatus that enhances the ultrasonic cleaning power by pouring fine air-bubbles into the cleaning fluid. Also, in Japanese Unexamined Patent Publication No. 8(1996)-141527, is described an ultrasonic cleaning apparatus in which the residue is exfoliated and removed by using an ultrasonic vibrator that vibrates at different frequencies. Furthermore, in Japanese Unexamined Patent Publication No. 8(1996)-108155 is described a cleaning apparatus that cleans an object to be cleaned with the object obliquely attached to the ultrasonic vibrator.

As mentioned above, according to the conventional cleaning apparatuses, the residue and dirts adhered to the object to be cleaned can be removed to some extent. However, polished tailings and residues confined in a groove of the object to be cleaned could not positively be removed.

SUMMARY OF THE INVENTION

It is an object of the present invention to provide a cleaning apparatus and a cleaning method that can substantially positively remove polished tailings and residues confined in grooves of the object to be cleaned.

According to the present invention, a cleaning apparatus includes a cleaning tank for reserving cleaning fluid, an object to be cleaned being immersed in the cleaning fluid, a vibrator for vibrating the cleaning fluid in the cleaning tank, and two micro-vibration sources for minutely vibrating the object to be cleaned in two different directions.

Furthermore, according to the present invention, a cleaning method for cleaning an object to be cleaned, has a step of immersing the object in cleaning fluid, a step of vibrating the cleaning fluid, and a step of minutely vibrating the object in two different directions during the vibration of the cleaning fluid.

The cleaning fluid in the cleaning tank is vibrated by a vibrator and, at the same time, an object to be cleaned is minutely vibrated in two different directions. Cleaning non-uniformities due to the vibrator cavitation carl be removed by minutely vibrating the object to be cleaned in two different directions by two micro-vibration sources.

It is preferred that the vibrator produces pressure distribution in the cleaning fluid in the cleaning tank, and that at least one of the micro-vibration sources presents to the object micro-vibration in a direction vertical and/or parallel to an advance direction of the pressure distribution.

It is also preferred that the two micro-vibration sources presents to the object micro-vibrations in two directions orthogonal to each other. Such crossing of vibration directions at right angle can facilitate the removal of polished tailings and residues confined in grooves or the like.

It is preferred that the vibrator produces pressure distribution in the cleaning fluid in the cleaning tank, and that at least one of the micro-vibration sources is rocked in a direction parallel to an advance direction of the pressure distribution.

It is further preferred that the cleaning tank has a wall to which the vibrator is attached, and that the two micro-vibration sources are rocked in a direction vertical to a surface of the wall of the cleaning tank. When the vibrator is attached to one wall surface of the cleaning tank, a sound pressure distribution is generated between this wall surface and opposite wall surface of the cleaning tank in the cleaning fluid in the cleaning tank. A larger cleaning effect is obtained at the maximum point in the sound pressure change and a smaller cleaning effect is obtained at the minimum point in the sound pressure change, thereby generating a cleaning non-uniformities. When the wall surface to attach the vibrator is a bottom surface, the opposite wall surface is a fluid surface. Oscillation of the minute vibration source in a direction vertical to this attaching wall surface oscillates the object to be cleaned along this sound pressure distribution. Accordingly the object does not remain only at the maximum or minimum point in the sound pressure change, thereby removing the cleaning non-uniformities.

It is preferred that the micro-vibration sources consist of oscillating horns.

Preferably, the vibrator is an ultrasonic oscillator and/or the micro-vibration sources are ultrasonic oscillators.

Further, objects and advantages of the present invention will be apparent from description of the preferred embodiments of the invention in the accompanying drawing.

DESCRIPTION OF THE PREFERRED EMBODIMENT

Figure 1:
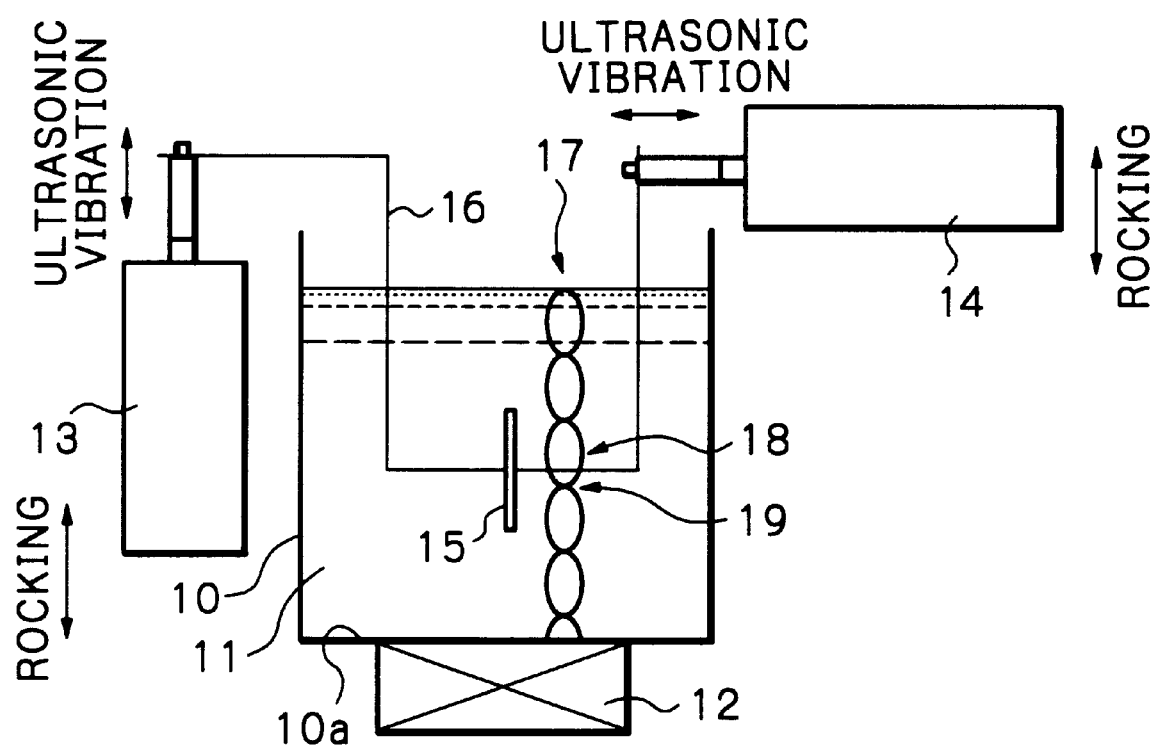
FIG. 1 schematically shows a constitution of a preferred embodiment of a cleaning apparatus according to the present invention.

In FIG. 1, a reference numeral 10 denotes a cleaning tank in which cleaning fluid 11 is stored. Also, reference numerals 12, 13, 14 and 15 denote an ultrasonic vibrator attached to a bottom wall 10a of the tank 10, first and second ultrasonic oscillating horns, and a wafer, i.e. an object to be cleaned, attached to the first, and second ultrasonic oscillating horns 13 and 14 through a support member 16, respectively.

As the cleaning fluid, pure water and cleaning fluid containing a water soluble detergent, solvent or the like can be used. The ultrasonic vibrator 12 attached to the bottom surface 10a of the tank 10 vibrates the cleaning fluid 11 in a direction vertical to the fluid surface from this bottom surface 10a, namely in upward and downward directions in FIG. 1. In the embodiment, 28 kHz of the vibration frequency is selected. It is apparent that the ultrasonic vibrator 12 may be attached to the wall surface of the cleaning tank 10 other than the bottom wall thereof. Although it is the most preferable that the vibration frequency is 28 kHz, it is not limited thereto. The vibration frequency may range from 26 to 40kHz.

In the present embodiment, the first and second ultrasonic oscillation horns 13 and 14 minutely vibrate the wafer 15 in orthogonal directions to each other. That is the first ultrasonic oscillating horn 13 performs an ultrasonic vibration in the upward and downward directions in FIG. 1, and the ultrasonic oscillating horn 14 performs an ultrasonic vibration in the left and right directions in FIG. 1. To the first and second ultrasonic oscillating horns 13 and 14 are secured both end portions of the support member 16, to which the wafer 15 is attached so that it is immersed in the cleaning fluid 11. In the embodiment, the wafer 15 is attached to the support member 16 in a manner that the surface of the wafer 15 is positioned in parallel to the upward and downward directions and perpendicularly to the vibration direction of the second ultrasonic oscillating horn 14, as shown in FIG. 1.

The horns 13 and 14 vibrate in orthogonal directions to each other. Nevertheless, the horns 13 and 14 can be designed so as to vibrate in optional two different directions with each other. The oscillation frequency of the horns 13 and 14 of the embodiment is set to 19.5 kHz. The 19.5 kHz of this oscillation frequency is particularly preferable. However, the frequency is not limited to 19.5 kHz and may be in a range of 14 to 30 kHz. Furthermore, it can be understood by those skilled in the art that the horns 13 and 14 may be oscillated at different frequencies with each other. As the horns 13 and 14, for example, a horn type oscillators for an ultrasonic cleaning machine, commercially available from Kaijo Co. Ltd. can be used.

The ultrasonic horns 13 and 14 are integral with the support member 16 and wafer 15 and are rocked in upward and downward directions, as shown in FIG. 1. This rocking operation is carried out at, for example, 20 strokes per minutes by a motor or the like. As the amplitude of the rocking of the horns 13 and 14, more than a half of the diameter of the wafer 15 can be selected. For example, if the diameter of the wafer 15 is 75 mm, the horns 13 and 14 are rocked at an amplitude of about 40 mm. It is preferred that the rocking direction is a direction perpendicular to the wall surface of the cleaning tank 10, to which wall the ultrasonic vibrator 12 is attached. In the embodiment in FIG. 1, this wall surface is the bottom wall 10a of the cleaning tank 10.

Operations of the ultrasonic cleaning apparatus of the embodiment will hereinafter be described with reference to a case of cleaning the wafer 15 for a thin-film magnetic head after the chemical mechanical polishing (CMP) process.

The CMP-processed wafer 15 is set to the support member 16 so that the surface of the wafer 15 is positioned in parallel to the upward and downward directions and perpendicularly to the vibration direction of the second ultrasonic oscillating horn 14, as shown in FIG. 1. In this conditions, the ultrasonic vibrator 12 and the first and second ultrasonic oscillating horns 13 and 14 vibrate to clean the wafer 15. In addition, the horns 13 and 14 are rocked in upward and downward directions.

The wafer 15 is cleaned by cavitation in the cleaning fluid, formed by vibration of the ultrasonic vibrator 12 while ultrasonically vibrating the wafer 15 itself in two directions mentioned above by the horns 13 and 14. Consequently, tailings of polished pad, residues and the like confined in respectively deep grooves on the element formation surface of the wafer 15 can be effectively removed. Such tailings, residues and the like could not be conventionally removed by only cavitation produced by the vibrator 12 attached to the bottom surface of the cleaning tank 10. In the present invention, after such tailings, residues and the like confined in the above mentioned groove are first, detached by the two directional ultrasonic vibration, they are then removed by the force of cavitation formed by the vibrator 12. Since in particular the ultrasonic vibrations generated by the horns 13 and 14 are performed in two direction perpendicular to each other, detachment of the tailings of polished pad, residue and the like produced during the CMP process is effectively carried out.

Furthermore, since the vibrator 12 is attached to the bottom surface 10a of the cleaning tank 10, a sound pressure distribution 17 is generated between the fluid surface and the bottom surface 10a in the fluid 11 in the cleaning tank 10 as shown in FIG. 1. Cavitation is generated also at the maximum point 18 in change of the sound pressure, thereby resulting in an improved cleaning effect. On the other hand, at the minimum point, 19 in the change of the sound pressure a cleaning effect is poor thereby generating the cleaning non-uniformities. However, according to the embodiment, the horns 13 and 14 are rocked in upward and downward directions. Thus, the wafer 15 is also rocked along the sound pressure distribution 17 and does not stop at only the maximum point 18 or minimum point 19 in the change of the sound pressure. Therefore, cleaning non-uniformities arid the like are remarkably removed.

Table 1 shows the number of remaining polished tailings confined in grooves in one wafer after the CMP process, actually measured before and after ultrasonic cleaning. Table 1 also shows the number of removal of the remaining tailings by the cleaning and the rate of the removal calculated from the measured result. In the cleaning for this measurement, in addition to the ultrasonic vibration by the vibrator 12, the wafer 15 was rocked in upward and downward directions. If the cleaning was carried out by only ultrasonic vibration by the horns 13 and 14, the rate of removal of the polished pad tailings was 30 to 40%.

TABLE 1

|  | THE NUMBER OF REMAINING TAILINGS OF POLISHED PAD | | THE NUMBER OF REMOVAL | RATE OF REMOVAL |
| --- | --- | --- | --- | --- |
|  | BEFORE CLEANING | AFTER CLEANING | BY CLEANING | BY CLEANING |
| CLEANING ONLY BY ULTRASONIC CAVITATION | 306 | 65 | 241 | 78.8% |
| CLEANING BY ULTRASONIC CAVITATION PLUS TWO DIRECTIONAL ULTRASONIC VIBRATIONS | 280 | 1 | 279 | 99.6% |

As apparent from Table 1, the rate of removal of the tailings by the cleaning, which was obtained in a case where the wafer 15 was cleaned only by cavitation due to the ultrasonic vibrator 12 is 78.8%. On the other hand, the rate of removal of the tailings by cleaning, which was obtained by using two directional ultrasonic vibration by the horns 13 and 14 with the above-mentioned cavitation due to the vibrator 12 is 99.6%. Therefore, the effect of using both the ultrasonic oscillating horns 13 and 14 and the ultrasonic vibrator 12 is 20% higher than that of using only the latter.

In the embodiment described above, as an object to be cleaned, a wafer for a thin-film magnetic head was used. However, in the cleaning apparatus according to the present invention, other various wafers and various objects to be cleaned other than the wafer can be naturally used.

Many widely different embodiments of the present invention may be constructed without departing from the spirit and scope of the present invention. It should be understood that the present invention is not limited to the specific embodiment described in the specification, except as defined in the appended claims.

What is claimed is:

1. A cleaning apparatus comprising:
   a cleaning tank for reserving cleaning fluid, an object to be cleaned being immersed in said cleaning fluid;
   a vibrator for vibrating said cleaning fluid in said cleaning tank; and
   two micro-vibration sources for minutely vibrating said object in two different directions.

2. The apparatus as claimed in claim 1, wherein said vibrator produces pressure distribution in said cleaning fluid in said cleaning tank, and wherein at least one of said micro-vibration sources presents to said object micro-vibration in a direction vertical to an advance direction of said pressure distribution.

3. The apparatus as claimed in claim 1, wherein said vibrator produces pressure distribution in said cleaning fluid in said cleaning tank, and wherein at least one of said micro-vibration sources presents to said object micro-vibration in a direction parallel to an advance direction or said pressure distribution.

4. The apparatus is claimed in claim 1, wherein said vibrator produces pressure distribution in said cleaning fluid in said cleaning tank, and wherein at least one of said micro-vibration sources is rocked in a direction parallel to an advance direction of said pressure distribution.

5. The apparatus as claimed in claim 1, wherein said two micro-vibration sources presents to said object micro-vibrations in two directions orthogonal to each other.

6. The apparatus as claimed in claim 1, wherein said cleaning tank has a wall to which said vibrator is attached, and wherein said two micro-vibration sources are rocked in a direction vertical to a surface of said wall of said clearing tank.

7. The apparatus as claimed in claim 1, wherein said micro-vibration sources consist of oscillating horns.

8. The apparatus as claimed in claim 1, wherein said vibrator is an ultrasonic oscillator.

9. The apparatus as claimed in claim 1, wherein said micro-vibration sources are ultrasonic oscillators.

* * * * *